(12) United States Patent
Noh et al.

(10) Patent No.: US 7,564,719 B2
(45) Date of Patent: Jul. 21, 2009

(54) METHOD OF PROGRAMMING IN A FLASH MEMORY DEVICE

(75) Inventors: Yu Jong Noh, Seoul (KR); Se Chun Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/962,049

(22) Filed: Dec. 20, 2007

(65) Prior Publication Data

US 2009/0040831 A1 Feb. 12, 2009

(30) Foreign Application Priority Data

Aug. 6, 2007 (KR) .................. 10-2007-0078556

(51) Int. Cl.
*G11C 16/04* (2006.01)
*G11C 16/06* (2006.01)

(52) U.S. Cl. .................. 365/185.28; 365/185.19; 365/185.22; 365/185.24

(58) Field of Classification Search ............. 365/185.28
See application file for complete search history.

(56) References Cited

U.S. PATENT DOCUMENTS

| | | | |
|---|---|---|---|
| 6,522,580 B2 * | 2/2003 | Chen et al. ............. | 365/185.02 |
| 6,925,004 B2 * | 8/2005 | Shibata et al. ......... | 365/185.03 |
| 7,257,032 B2 * | 8/2007 | Fujiu et al. ............. | 365/185.24 |
| 7,272,039 B2 * | 9/2007 | Rudeck et al. ......... | 365/185.02 |
| 7,324,383 B2 * | 1/2008 | Incarnati et al. ........ | 365/185.22 |
| 7,352,624 B2 * | 4/2008 | Roohparvar ........... | 365/185.17 |
| 7,433,240 B2 * | 10/2008 | Kim ...................... | 365/185.23 |
| 7,489,558 B2 * | 2/2009 | Choi et al. ............. | 365/185.24 |
| 2007/0025155 A1 * | 2/2007 | Hwang et al. .......... | 365/185.19 |
| 2007/0279989 A1 * | 12/2007 | Aritome ................ | 365/185.18 |
| 2008/0205139 A1 * | 8/2008 | Futatsuyama .......... | 365/185.03 |
| 2009/0003078 A1 * | 1/2009 | Mihnea et al. ......... | 365/185.22 |

* cited by examiner

*Primary Examiner*—Son L Mai
(74) *Attorney, Agent, or Firm*—Townsend and Townsend and Crew LLP

(57) ABSTRACT

A method of programming in a flash memory device is disclosed. The method includes programming a first memory cell coupled to an even bit line by applying a first program voltage to a word line, verifying whether or not the first memory cell is programmed through a first verifying voltage, and programming the first memory cell using a program voltage increased in sequence by a step voltage than the first program voltage in case that the first memory cell is not programmed programming a second memory cell coupled to an odd bit line by applying the first program voltage to the word line, and verifying whether or not the second memory cell is programmed through a second verifying voltage higher than the first verifying voltage, and programming the second memory cell using a program voltage increased in sequence by the step voltage than the first program voltage in case that the second memory cell is not programmed.

9 Claims, 2 Drawing Sheets

METHOD OF PROGRAMMING IN A FLASH MEMORY DEVICE

CROSS-REFERENCE TO RELATED APPLICATIONS

This application claims priority from Korean Patent Application No. 2007-78556, filed on Aug. 06, 2007, the contents of which are incorporated herein by reference in its entirety.

BACKGROUND OF THE INVENTION

The present invention relates to a method of programming a flash memory device. More particularly, the present invention relates to a method of programming which reduces a threshold voltage imbalance due to interference effects in the flash memory device.

Recently, the demand has increased for a non-volatile memory device which electrically programs and erases data, and does not require a refresh function for periodically rewriting data.

In addition, high integration techniques for a memory device have been studied so as to develop a high capacity memory device (e.g., flash memory device).

Generally, a flash memory device is divided into a NAND flash memory and a NOR flash memory. In the NOR flash memory, each of the memory cells is connected independently to a bit line and a word line, and so the NOR flash memory has excellent random access time. Whereas, in the NAND flash memory, only one contact is required for one cell string because memory cells are connected in series, and so the NAND flash memory has excellent characteristics for integration. Accordingly, the NAND flash memory has been generally employed in high density flash memory.

Recently, multi-bit cells for storing a plurality of data bits in one memory cell have been actively studied so as to enhance the degree of integration of the above flash memory. This memory cell is referred to as a multi-level cell (hereinafter, referred to as "MLC"). A memory cell for storing one data bit is referred to as a single level cell (SLC).

Since the MLC has at least four threshold voltage levels compared to an SLC which has two threshold voltage levels, the MLC can increase the number of bits by two or more times over the SLC.

On the other hand, it is important to reduce a change in the threshold voltage of a cell so as to embody the MLC. Here, one of the causes for the change is an interference effect due to capacitance between cells.

FIG. 1 is a view illustrating a threshold voltage distribution related to a conventional method of programming in a flash memory device.

Generally, a memory cell array included in the flash memory device has a cell string structure in which memory cells are connected in series, wherein the memory cells are connected to an even bit line or an odd bit line. Here, the odd bit line is adjacent to the even bit line.

In a program operation of the flash memory device, a first memory cell is programmed by applying a program voltage (e.g., 15V) to a word line of the first memory cell connected to the even bit line, and so the first memory cell has a threshold voltage distribution as shown in A of FIG. 1.

Subsequently, a second memory cell connected to the odd bit line adjacent to the first memory cell is programmed by applying the program voltage (e.g., 15V) to a word line of the second memory cell, and so the second memory cell has a threshold voltage distribution as shown in A' of FIG. 1. In this case, the threshold voltage distribution of the first memory cell is shifted from A into B due to the interference effect when the second memory cell is programmed.

This change of the threshold voltage distribution deteriorates program characteristics of the flash memory device. Specially, sensing margin is reduced due to the change of the threshold voltage distribution in the MLC flash memory device.

SUMMARY OF THE INVENTION

It is a feature of the present invention to provide a method of programming in a flash memory device for performing a program operation related to an even bit line using a second verifying voltage smaller than a first verifying voltage so that threshold voltage distribution is smaller than usual threshold voltage distribution, wherein the first verifying voltage relates to a program operation of an odd bit line, and the second verifying voltage relates to the program operation of the even bit line. Then, threshold voltage distribution of a memory cell coupled to the even bit line is shifted into normal threshold voltage distribution due to an interference effect in accordance with a program voltage used when the program operation related to the odd bit line is performed. As a result, the memory cell coupled to the even bit line has the same threshold voltage distribution as a memory cell coupled to the odd bit line.

A method of programming in a flash memory device using ISPP program method according to on an embodiment of the present invention includes programming a first memory cell coupled to an even bit line using a first program voltage increased in sequence by a first step voltage; and programming a second memory cell coupled to an odd bit line using a second program voltage increased in sequence by a second step voltage, wherein the second step voltage is higher than the first step voltage.

A method of programming in a flash memory device according to another embodiment of the present invention includes programming a first memory cell by applying a first program voltage to a word line related to the first memory cell coupled to a first bit line; applying a second program voltage higher by a first step voltage than the first program voltage to the word line in case that the first memory cell is not programmed, and programming the first memory cell by applying new program voltage increased by the first step voltage until the first memory cell is programmed; programming a second memory cell by applying the first program voltage to a word line related to the second memory cell coupled to a second bit line, wherein the second bit line is adjacent to the first bit line; and applying a program voltage higher by a second step voltage than the first program voltage to the word line in case that the second memory cell is not programmed, and programming the second memory cell by applying new program voltage increased by the second step voltage until the second memory cell is programmed, wherein the second step voltage is higher than the first step voltage.

A method of programming in a flash memory device according to still another embodiment of the present invention includes performing a first program operation so that threshold voltage of a first memory cell coupled to a first bit line is increased to a first voltage smaller than an objection voltage; and performing a second program operation so that threshold voltage of a second memory cell coupled to a second bit line is increased to a second level identical to or higher than the objection voltage and the threshold voltage of the first memory cell is increased to a third level identical to or higher than the objection voltage.

A method of programming in a flash memory device according to still another embodiment of the present invention includes programming a first memory cell by applying a first program voltage to a word line related to the first memory cell coupled to a first bit line; verifying whether or not the first memory cell is programmed by applying a first verifying voltage smaller than an objection voltage to the word line; programming a second memory cell by applying a second program voltage to a word line related to the second memory cell coupled to a second bit line adjacent to the first bit line; and verifying whether or not the second memory cell is programmed by applying a second verifying voltage identical to the objection voltage to the word line.

A method of programming in a flash memory device according to still another embodiment of the present invention includes programming a first memory cell coupled to an even bit line by applying a first program voltage to a word line; verifying whether or not the first memory cell is programmed through a first verifying voltage, and programming the first memory cell using a program voltage increased in sequence by a step voltage than the first program voltage in case that the first memory cell is not programmed; programming a second memory cell coupled to an odd bit line by applying the first program voltage to the word line; and verifying whether or not the second memory cell is programmed through a second verifying voltage higher than the first verifying voltage, and programming the second memory cell using a program voltage increased in sequence by the step voltage than the first program voltage in case that the second memory cell is not programmed.

As described above, a method of programming in a flash memory device performs a program operation related to an even bit line using a second verifying voltage smaller than a first verifying voltage so that threshold voltage distribution is smaller than usual threshold voltage distribution, wherein the first verifying voltage relates to a program operation of an odd bit line, and the second verifying voltage relates to the program operation of the even bit line. Then, threshold voltage distribution of a memory cell coupled to the even bit line is shifted into normal threshold voltage distribution due to an interference effect in accordance with a program voltage used when the program operation related to the odd bit line is performed. As a result, the memory cell coupled to the even bit line may have the same threshold voltage distribution as a memory cell coupled to the odd bit line.

DESCRIPTION OF SPECIFIC EMBODIMENTS

Hereinafter, the embodiments of the present invention will be explained in more detail with reference to the accompanying drawings.

Figure 1:
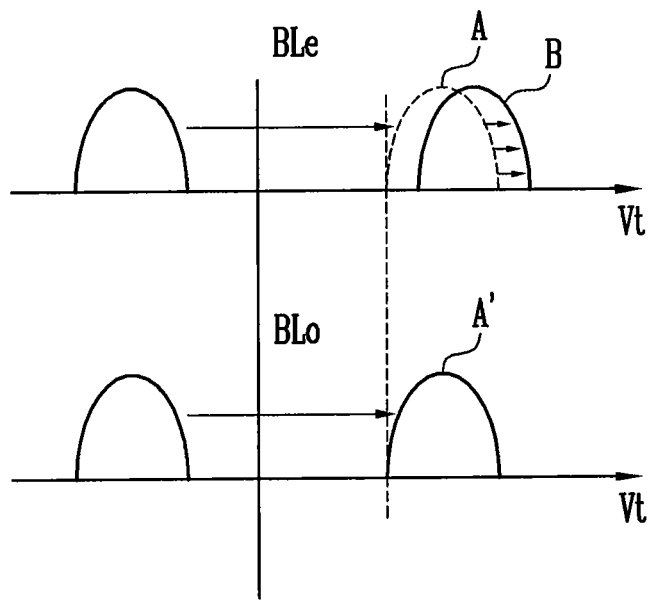
FIG. 1 is a view illustrating a threshold voltage distribution related to a conventional method of programming in a flash memory device.
Figure 2:
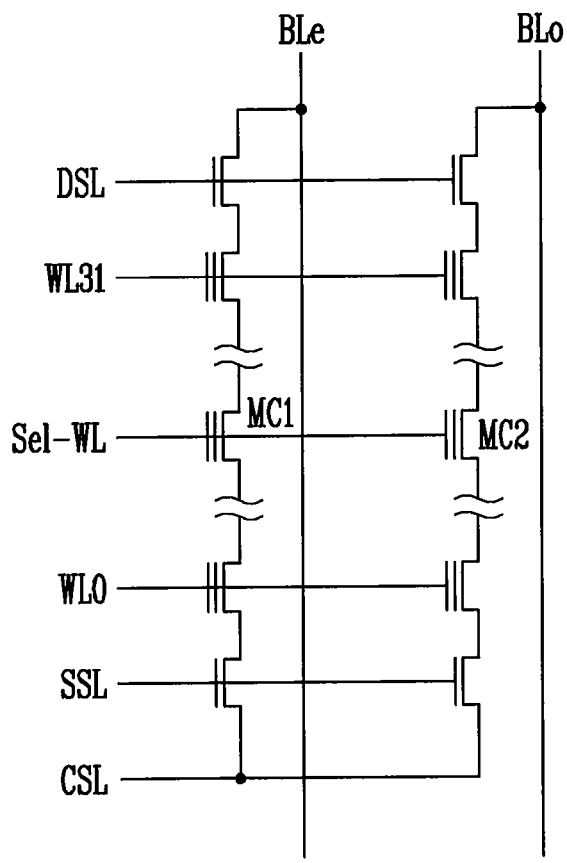
FIG. 2 is a view illustrating a memory cell array in a flash memory device according to a first embodiment and a second embodiment of the present invention.
Figure 3:
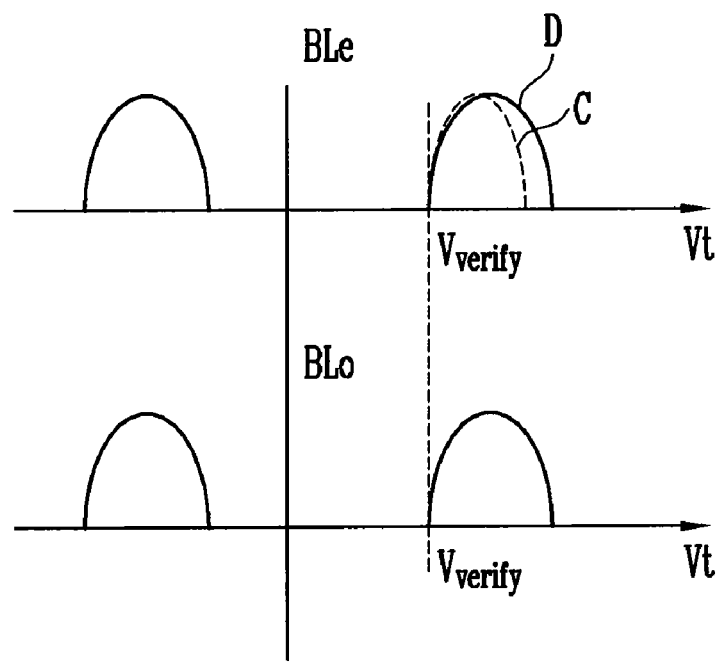
FIG. 3 is a view illustrating threshold voltage distribution in a method of programming a flash memory device according to a first embodiment of the present invention.

FIG. 2 is a view illustrating a memory cell array in a flash memory device according to a first embodiment and a second embodiment of the present invention. FIG. 3 is a view illustrating threshold voltage distribution in a method of programming a flash memory device according to a first embodiment of the present invention.

Hereinafter, a method of programming in the flash memory device according to the first embodiment of the present invention will be described in detail with reference to drawings FIG. 2 and FIG. 3. It is desirable that the method uses an incremental step pulse programming (ISPP) method.

Firstly, a first memory cell MC1 coupled to an even bit line is programmed. Particularly, a first program voltage is applied to a word line coupled to the first memory cell MC1. A pass voltage is applied to word lines not connected to the first memory cell MC1 so as to prevent program of those memory cells.

Subsequently, it is verified whether or not the first memory cell MC1 is programmed by applying a verifying voltage Vverify to a corresponding word line in a verifying operation.

If it is verified that the first memory cell MC1 is programmed, the program operation is ended. However, if it is verified that the first memory cell MC1 is not programmed, a second program voltage higher than the first program voltage is applied to the word line. In one embodiment of the present invention, a difference in the first program voltage and the second program voltage (i.e., first step voltage) is 0.15V to 0.5V, preferably 0.3V.

Thereafter, if it is verified that the first memory cell MC1 is programmed by the verifying operation, the program operation is ended. However, if it is verified that the first memory cell MC1 is not programmed by the verifying operation, the program operation is performed again by applying a third program voltage higher than the second program voltage by the first step voltage to the word line. The program and the verifying operation are repeatedly performed until the first memory cell MC1 is programmed.

Once the first memory cell MC1 has been programmed, the first memory cell MC1 has threshold voltage distribution as shown in C of FIG. 3. Here, the threshold voltage distribution of the first memory cell MC1 has a narrow width because the first step voltage smaller than a conventional step voltage is used. The conventional step voltage is 0.5 V to 1.0 V.

Subsequently, a second memory cell MC2 coupled to the odd bit line BLo is programmed. A pass voltage is applied to word lines not connected to the second memory cell MC2 so as to prevent program of those memory cells.

Then, it is verified whether or not the second memory cell MC2 is programmed by performing a verifying operation.

If it is verified that the second memory cell MC2 is programmed, the program operation is ended. However, if it is verified that the second memory cell MC2 is not programmed, a second program voltage higher than the first program voltage is applied to the word line. Here, the difference of the first program voltage and the second program voltage (i.e., second step voltage) is greater than the first step voltage used in the process of programming the first memory cell MC1 coupled to the even bit line BLe. For example, the second step voltage is 0.15V to 0.5V, preferably 0.4V. The second step voltage is greater than the first step voltage by about 0.01V in the present embodiment. In another embodiment, the difference is 0.07V. In yet another embodiment, the difference is 0.13V, 0.15, or 0.18V. The program and the verifying operation are repeatedly performed until the second memory cell MC2 is programmed.

The threshold voltage distribution of the programmed first memory cell MC1 is shifted from C into D due to the interference effect (or disturbance effect or program disturb) in accordance with the program voltage used when the second memory cell MC2 is programmed. In other words, the threshold voltage distribution of the first memory cell MC1 is shifted to have substantially the same threshold voltage distribution as the second memory cell MC2. As a result, threshold voltage distributions of the memory cells MC1 and MC2 coupled to the bit lines BLe and BLo are improved.

Figure 4:
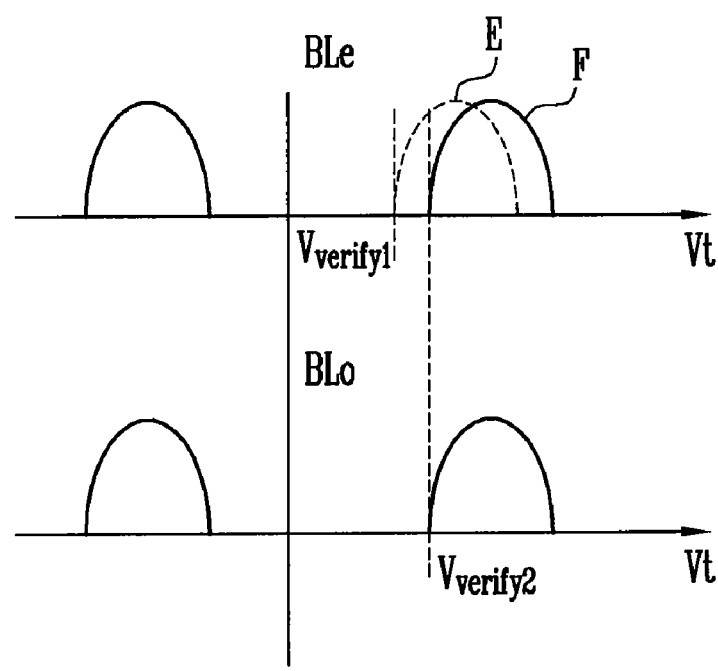
FIG. 4 is a view illustrating threshold voltage distribution in a method of programming a flash memory device according to a second embodiment of the present invention.

FIG. 4 is a view illustrating threshold voltage distribution in a method of programming a flash memory device according to a second embodiment of the present invention.

Hereinafter, the method of programming a flash memory device according to the second embodiment of the present invention will be described in detail with reference to FIG. 2 and FIG. 4. It is desirable that the method uses the ISPP method.

Firstly, a first memory cell MC1 coupled to the even bit line BLe is programmed. Particularly, a first program voltage is applied to a word line coupled to the first memory cell MC1. A pass voltage is applied to word lines not connected to the first memory cell MC1 so as to prevent program of those memory cells.

Subsequently, it is verified whether or not the first memory cell MC1 is programmed through a verifying operation. Here, the verifying operation is performed by applying a first verifying voltage Vverify1 to the word line connected to the first memory cell MC1 and detecting a voltage of the even bit line BLe.

That is, the program of the first memory cell MC1 is verified through detection as to whether a precharged even bit line BLe is discharged or maintains its voltage level when the first verifying voltage Vverify1 is applied. Here, it is desirable that the first verifying voltage Vverify1 is smaller than a second verifying voltage Vverify2 used when a second memory cell MC2 coupled to the odd bit line BLo is verified. In the present embodiment, the second verifying voltage Vverify2 has the same voltage as the conventional verifying voltage Vverify.

If it is verified that the first memory cell MC1 is programmed, the program operation is ended. However, if it is verified that the first memory cell MC1 is not programmed, a second program voltage higher than the first program voltage is applied to the word line of the first memory cell MC1. Here, the step voltage is 0.3V. The program operation and the verifying operation are repeatedly performed until the first memory cell MC1 is programmed. The first verify voltage Vverify1 is used for the verification step during this stage.

Once the first memory cell MC1 has been programmed, the first memory cell MC1 has a threshold voltage distribution as shown in E of FIG. 4.

Subsequently, the second memory cell MC2 coupled to the odd bit line BLo is programmed. Here, a pass voltage is applied to word lines not connected to the second memory cell MC2 so as to prevent program of those memory cells.

Then, it is verified whether or not the second memory cell MC2 is programmed. Here, it is desirable that the second verifying voltage Vverify2 is higher than the first verifying voltage Vverify1. In the present embodiment, the second verifying voltage Vverify2 is higher than the first verifying voltage Vverify1.

If it is verified that the second memory cell MC2 is programmed, the program operation is ended. However, if it is verified that the second memory cell MC2 is not programmed, a second program voltage higher than the first program voltage is applied to the word line of the second memory cell MC2. The program and the verifying operation are repeatedly performed until the second memory cell MC2 is programmed.

The threshold voltage distribution of the programmed memory cell MC2 is located in a more right direction compared to the threshold voltage distribution of the programmed memory cell MC1 by performing the program operation using the second verifying voltage Vverify2 higher than the first verifying voltage Vverify1 used when the first memory cell MC1 is programmed.

The threshold voltage distribution of the first memory cell MC1 is shifted from E into F due to the interference effect in accordance with the program voltage used when the second memory cell MC2 is programmed. As a result, the first memory cell MC1 has substantially the same threshold voltage distribution as the second memory cell MC2. Accordingly, the threshold voltage distributions of the memory cells MC1 and MC2 coupled to the bit lines BLe and BLo are improved.

In the embodiments above, the memory cells are described as being grouped together in a unit of even and odd bit lines (or even and odd cell strings). As will be understood by those skilled in the art, the present invention is not limited to a memory cell array having such a configuration. As used herein, the even and odd bit lines (or cell strings) refer to bit lines (or cell strings) that are adjacent to each other. For example, the memory cells may be grouped together in a unit of three or more bit lines.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of programming in a flash memory device using an incremental step pulse programming (ISPP) method, the method comprising:

programming a first memory cell coupled to a first bit line using a first program voltage that is increased by a first step voltage; and programming a second memory cell coupled to a second bit line using a second program voltage that is increased by a second step voltage, wherein the second step voltage is greater than the first step voltage, wherein the first and second bit lines are provided adjacent to each other.

2. A method of programming in a flash memory device, the method comprising:

applying a first program voltage to a word line associated with a first memory cell that is coupled to a first bit line;

applying a second program voltage to the word line associated with the first memory cell if the first memory cell is determined not to have been programmed by the first program voltage, the second program voltage being greater than the first program voltage by a first step voltage;

applying the first program voltage to a word line associated with a second memory cell that is coupled to a second bit line, wherein the second bit line is adjacent to the first bit line; and applying a third program voltage to the word line associated with the second memory cell if the second memory cell is determined not to have been programmed, wherein the third program voltage is greater than the first program voltage by a second step voltage, and the second step voltage is greater than the first step voltage.

3. The method of claim 2, wherein the second step voltage is greater than the first step voltage by about 0.1V.

4. The method of claim 2, wherein the first step voltage is about 0.3V, and the second step voltage is about 0.4V.

5. A method of programming in a flash memory device, the method comprising:

performing a first program operation so that a threshold voltage of a first memory cell coupled to a first bit line is increased to a first voltage less than a reference voltage; and performing a second program operation so that a threshold voltage of a second memory cell coupled to a second bit line is increased to a second level that is identical to or greater than the reference voltage and the threshold voltage of the first memory cell is increased to a third level that is identical to or greater than the objection voltage.

6. A method of programming in a flash memory device, the method comprising:

applying a first program voltage to a word line associated with a first memory cell, the first memory cell being coupled to a first bit line;

verifying whether or not the first memory cell is programmed by applying a first verifying voltage to the word line associated with the first memory cell;

applying a second program voltage to a word line associated with a second memory cell, the second memory cell being coupled to a second bit line adjacent to the first bit line; and verifying whether or not the second memory cell is programmed by applying a second verifying voltage to the word line associated with the second memory cell, the second verifying voltage being greater than the first verifying voltage.

7. The method of claim 6, further comprising:

ending the program of the first memory cell if the first memory cell is determined to have been programmed properly; and applying a program voltage higher by a step voltage than the first program voltage to the word line associated with the first memory cell if the first memory cell is determined not to have been programmed properly.

8. The method of claim 6, wherein an incremental step pulse programming method is used to program the first and second memory cells.

9. A method of programming in a flash memory device, the method comprising:

applying a first program voltage to a first word line associated with a first memory cell, the first memory cell being coupled to a first bit line;

verifying whether or not the first memory cell is programmed by applying a first verifying voltage to the first word line;

applying a second program voltage to the first word line if the first memory cell is determined not to have been programmed, the second program voltage being greater than the first program voltage by a first step voltage;

applying a third program voltage to a second word line associated with a second memory cell, the second memory cell being coupled to a second bit line adjacent to the first bit line;

verifying whether or not the second memory cell is programmed by applying a second verifying voltage to the second word line, the second verifying voltage being greater than the first verifying voltage;

applying a fourth program voltage to the second word line if the second word line is determined not to have been programmed, the fourth program voltage being greater than the third program voltage by a second step voltage, the second step voltage being greater than the first step voltage.

* * * * *